United States Patent
Lin et al.

(10) Patent No.: US 10,008,382 B2
(45) Date of Patent: Jun. 26, 2018

(54) SEMICONDUCTOR DEVICE HAVING A POROUS LOW-K STRUCTURE

(71) Applicant: TAIWAN SEMICONDUCTOR MANUFACTURING COMPANY, LTD., Hsin-Chu (TW)

(72) Inventors: Bo-Jiun Lin, Jhubei (TW); Hai-Ching Chen, Hsinchu (TW); Tien-I Bao, Dayuan Township (TW)

(73) Assignee: TAIWAN SEMICONDUCTOR MANUFACTURING COMPANY, LTD., Hsin-Chu (TW)

(*) Notice: Subject to any disclaimer, the term of this patent is extended or adjusted under 35 U.S.C. 154(b) by 0 days. days.

(21) Appl. No.: 14/813,177

(22) Filed: Jul. 30, 2015

(65) Prior Publication Data
US 2017/0033043 A1    Feb. 2, 2017

(51) Int. Cl.
*H01L 23/52* (2006.01)
*H01L 29/06* (2006.01)
(Continued)

(52) U.S. Cl.
CPC .... *H01L 21/02203* (2013.01); *H01L 21/7682* (2013.01); *H01L 21/76826* (2013.01); *H01L 21/76834* (2013.01); *H01L 23/5329* (2013.01); *H01L 21/764* (2013.01); *H01L 21/76885* (2013.01); *H01L 23/528* (2013.01);
(Continued)

(58) Field of Classification Search
CPC .............. H01L 23/5226; H01L 23/528; H01L 29/0649; H01L 21/02203; H01L 21/764; H01L 2221/1047
See application file for complete search history.

(56) References Cited

U.S. PATENT DOCUMENTS 5,561,318 A * 10/1996 Gnade ............... H01L 21/02126
257/637
5,936,295 A * 8/1999 Havemann ........ H01L 21/02126
257/522

(Continued)

FOREIGN PATENT DOCUMENTS

JP   2005000780 A   1/2005
JP   2013-012653 A  1/2013

(Continued)

OTHER PUBLICATIONS

Korean Application No. 10-2015-0159825, Office Action dated Sep. 8, 2016, 12 pgs.

(Continued)

Primary Examiner — Ida M Soward
(74) Attorney, Agent, or Firm — Haynes and Boone, LLP

(57) ABSTRACT

The present disclosure involves forming a porous low-k dielectric structure. A plurality of conductive elements is formed over the substrate. The conductive elements are separated from one another by a plurality of openings. A barrier layer is formed over the conductive elements. The barrier layer is formed to cover sidewalls of the openings. A treatment process is performed to the barrier layer. The barrier layer becomes hydrophilic after the treatment process is performed. A dielectric material is formed over the barrier layer after the treatment process has been performed. The dielectric material fills the openings and contains a plurality of porogens.

20 Claims, 14 Drawing Sheets

(51) Int. Cl.
  *H01L 21/02* (2006.01)
  *H01L 21/76* (2006.01)
  *H01L 21/764* (2006.01)
  *H01L 23/522* (2006.01)
  *H01L 23/528* (2006.01)
  *H01L 23/532* (2006.01)
  *H01L 21/768* (2006.01)

(52) U.S. Cl.
  CPC .... *H01L 23/5226* (2013.01); *H01L 23/53223* (2013.01); *H01L 23/53238* (2013.01); *H01L 23/53266* (2013.01); *H01L 29/0649* (2013.01); *H01L 2221/1047* (2013.01)

(56) References Cited

U.S. PATENT DOCUMENTS

| | | | | |
|---|---|---|---|---|
| 6,035,530 | A * | 3/2000 | Hong | H01L 21/7682 257/E21.581 |
| 6,156,374 | A * | 12/2000 | Forbes | H01L 21/02164 257/E21.273 |
| 6,159,842 | A * | 12/2000 | Chang | H01L 21/76801 216/2 |
| 6,514,881 | B1 * | 2/2003 | Coffman | H01L 21/02126 257/E21.269 |
| 6,528,145 | B1 * | 3/2003 | Berger | H01L 21/4857 174/256 |
| 6,774,057 | B1 * | 8/2004 | Lu | H01L 21/02126 257/E21.259 |
| 6,905,938 | B2 * | 6/2005 | Yang | H01L 21/76801 257/E21.275 |
| 6,958,524 | B2 * | 10/2005 | Li | H01L 21/02126 257/635 |
| 7,923,820 | B2 * | 4/2011 | Jeannot | H01L 21/02126 257/499 |
| 8,039,179 | B2 | 10/2011 | Shieh et al. | |
| 8,202,681 | B2 | 6/2012 | Lin et al. | |
| 8,569,803 | B2 * | 10/2013 | Tyberg | H01L 23/5226 257/213 |
| 8,728,332 | B2 | 5/2014 | Lin et al. | |
| 8,822,243 | B2 | 9/2014 | Yan et al. | |
| RE45,781 | E * | 10/2015 | Hedrick | |
| 9,177,864 | B2 * | 11/2015 | Lei | H01L 21/78 |
| 9,263,330 | B2 * | 2/2016 | Chen | H01L 21/31116 |
| 9,330,963 | B2 * | 5/2016 | King | H01L 21/02178 |
| 9,343,294 | B2 * | 5/2016 | Chi | H01L 23/528 |
| 9,490,205 | B2 * | 11/2016 | Tsai | H01L 21/76885 |
| 9,633,949 | B2 * | 4/2017 | Lu | H01L 23/5384 |
| 2005/0212135 | A1 * | 9/2005 | Wu | H01L 21/7682 257/758 |
| 2005/0266698 | A1 * | 12/2005 | Cooney, III | H01L 21/02107 438/765 |
| 2006/0003600 | A1 * | 1/2006 | Barns | H01L 21/31051 438/780 |
| 2006/0043589 | A1 * | 3/2006 | Iwasaki | H01L 21/3105 257/751 |
| 2006/0091468 | A1 | 5/2006 | Liaw | |
| 2006/0115982 | A1 * | 6/2006 | Morisue | H01L 21/288 438/638 |
| 2006/0121721 | A1 | 6/2006 | Lee et al. | |
| 2007/0037385 | A1 * | 2/2007 | Huebinger | H01L 21/02063 438/638 |
| 2007/0052101 | A1 * | 3/2007 | Usami | H01L 21/76801 257/758 |
| 2007/0200162 | A1 * | 8/2007 | Tu | H01L 27/10852 257/314 |
| 2009/0122460 | A1 * | 5/2009 | Gschwandtner | H01G 4/008 361/305 |
| 2010/0093168 | A1 * | 4/2010 | Naik | H01L 21/31144 438/618 |
| 2011/0281208 | A1 | 11/2011 | Lin et al. | |
| 2012/0081777 | A1 * | 4/2012 | Heikenfeld | G02B 26/005 359/290 |
| 2012/0156890 | A1 * | 6/2012 | Yim | H01L 21/02126 438/763 |
| 2012/0278776 | A1 | 11/2012 | Lei et al. | |
| 2013/0295769 | A1 | 11/2013 | Lin et al. | |
| 2013/0320451 | A1 | 12/2013 | Liu et al. | |
| 2014/0065818 | A1 * | 3/2014 | Lu | H01L 21/76885 438/653 |
| 2014/0193974 | A1 | 7/2014 | Lee et al. | |
| 2014/0215421 | A1 | 7/2014 | Chen et al. | |
| 2014/0242794 | A1 | 8/2014 | Lin et al. | |
| 2014/0264760 | A1 | 9/2014 | Chang et al. | |
| 2014/0264899 | A1 | 9/2014 | Chang et al. | |
| 2014/0273442 | A1 | 9/2014 | Liu et al. | |
| 2014/0273446 | A1 | 9/2014 | Huang et al. | |
| 2014/0377937 | A1 | 12/2014 | Lei et al. | |
| 2015/0132952 | A1 * | 5/2015 | Tsai | H01L 21/76802 438/674 |
| 2015/0279730 | A1 * | 10/2015 | Uzoh | H01L 23/5283 257/774 |

FOREIGN PATENT DOCUMENTS

| | | |
|---|---|---|
| KR | 20000076869 A | 12/2000 |
| KR | 20060064289 A | 6/2006 |
| TW | 201511101 A | 3/2014 |
| TW | 201523734 A | 6/2015 |

OTHER PUBLICATIONS

Taiwanese Application No. 10521056290, Office Action dated Aug. 25, 2016, 5 pgs.
Notice of Allowance for Korean Application No. 10-2015-0159825, dated Jan. 3, 2018, 3 pgs.

* cited by examiner

First component of precursor: No Si-Me

Second component of precursor: With Si-Me

SEMICONDUCTOR DEVICE HAVING A POROUS LOW-K STRUCTURE

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of integrated circuit evolution, functional density (i.e., the number of interconnected devices per chip area) has generally increased while geometry size (i.e., the smallest component (or line) that can be created using a fabrication process) has decreased.

As a part of the semiconductor fabrication, metal trenches may be formed. The metal trenches may serve as the metal lines that provide interconnections for the various components for an IC. The metal trenches are separated by a low-k dielectric material. However, conventional semiconductor fabrication techniques have not provided a low-k dielectric material that is porous enough. This may adversely affect the performance of the conventional semiconductor ICs.

Therefore, while the low-k materials in conventional ICs have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
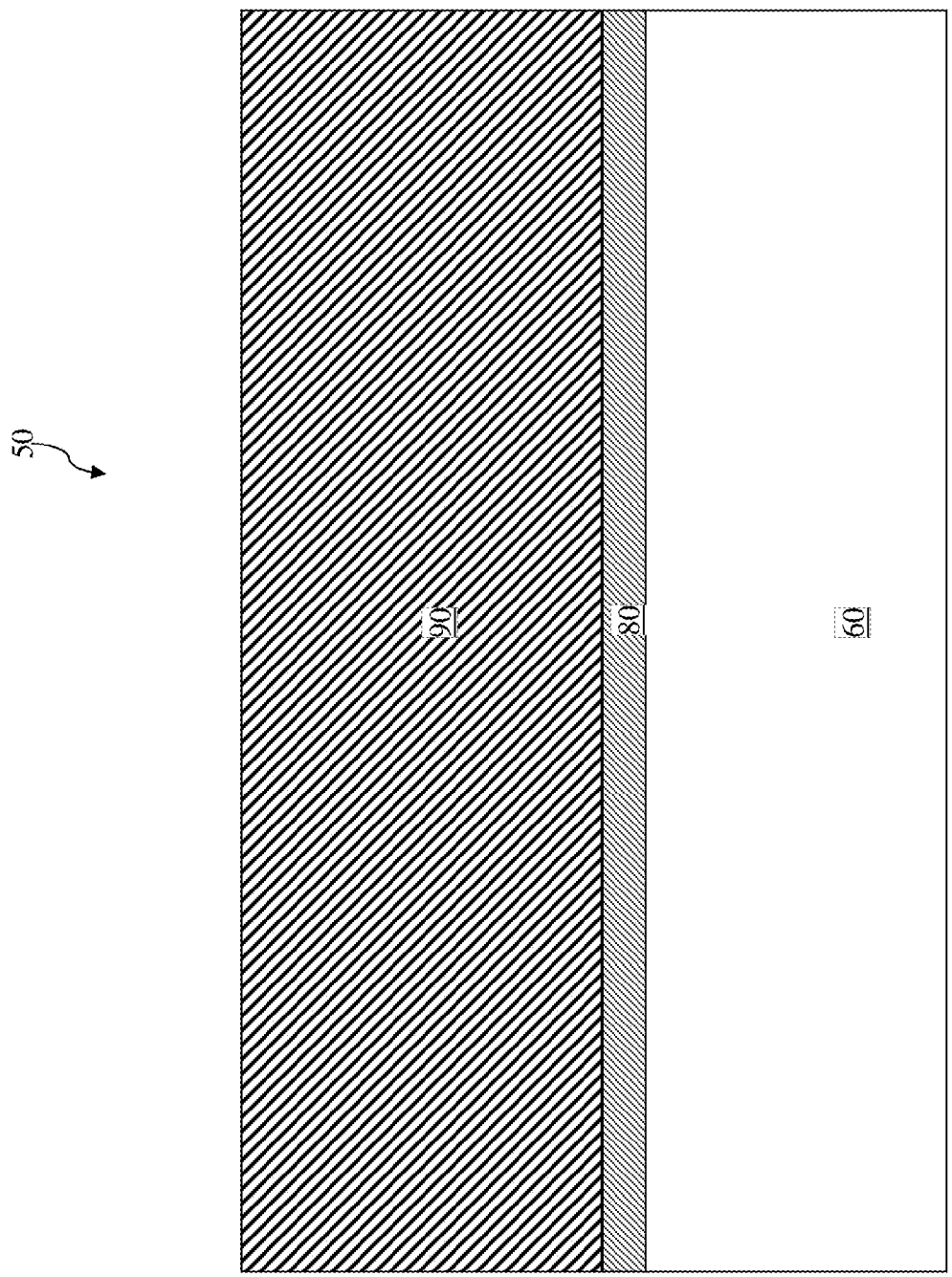
FIGS. 1-5 and 9-12 are diagrammatic cross-sectional side views of a semiconductor device at various stages of fabrication in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As semiconductor fabrication technologies continue to evolve, low-k dielectric materials have been used to provide isolation between conductive elements (such as metal trenches) in an integrated circuit (IC). A low-k dielectric material may refer to materials whose dielectric constant is lower than that of silicon dioxide, which is about 3.9. In other words, low-k dielectric materials have dielectric constants less than about 3.9. Typically, as the porosity of a dielectric material increases, the dielectric material exhibits better low-k properties, which is desirable. For example, a more porous low-k structure may offer better RxC performance. Unfortunately, conventional semiconductor fabrication has not been able to provide a dielectric structure with sufficient porosity. Therefore, the embodiments of the present disclosure discussed below relate to a low-k dielectric structure having increased porosity and a method of fabricating such low-k dielectric structure.

FIGS. 1-5 and 9-12 are diagrammatic fragmentary cross-sectional side views of a semiconductor device 50 at various stages of fabrication in accordance with various aspects of the present disclosure. The semiconductor device 50 may include an integrated circuit (IC) chip, system on chip (SoC), or portion thereof, and may include various passive and active microelectronic devices such as resistors, capacitors, inductors, diodes, metal-oxide semiconductor field effect transistors (MOSFET), complementary metal-oxide semiconductor (CMOS) transistors, bipolar junction transistors (BJT), laterally diffused MOS (LDMOS) transistors, high power MOS transistors, or other types of transistors.

Figure 2:
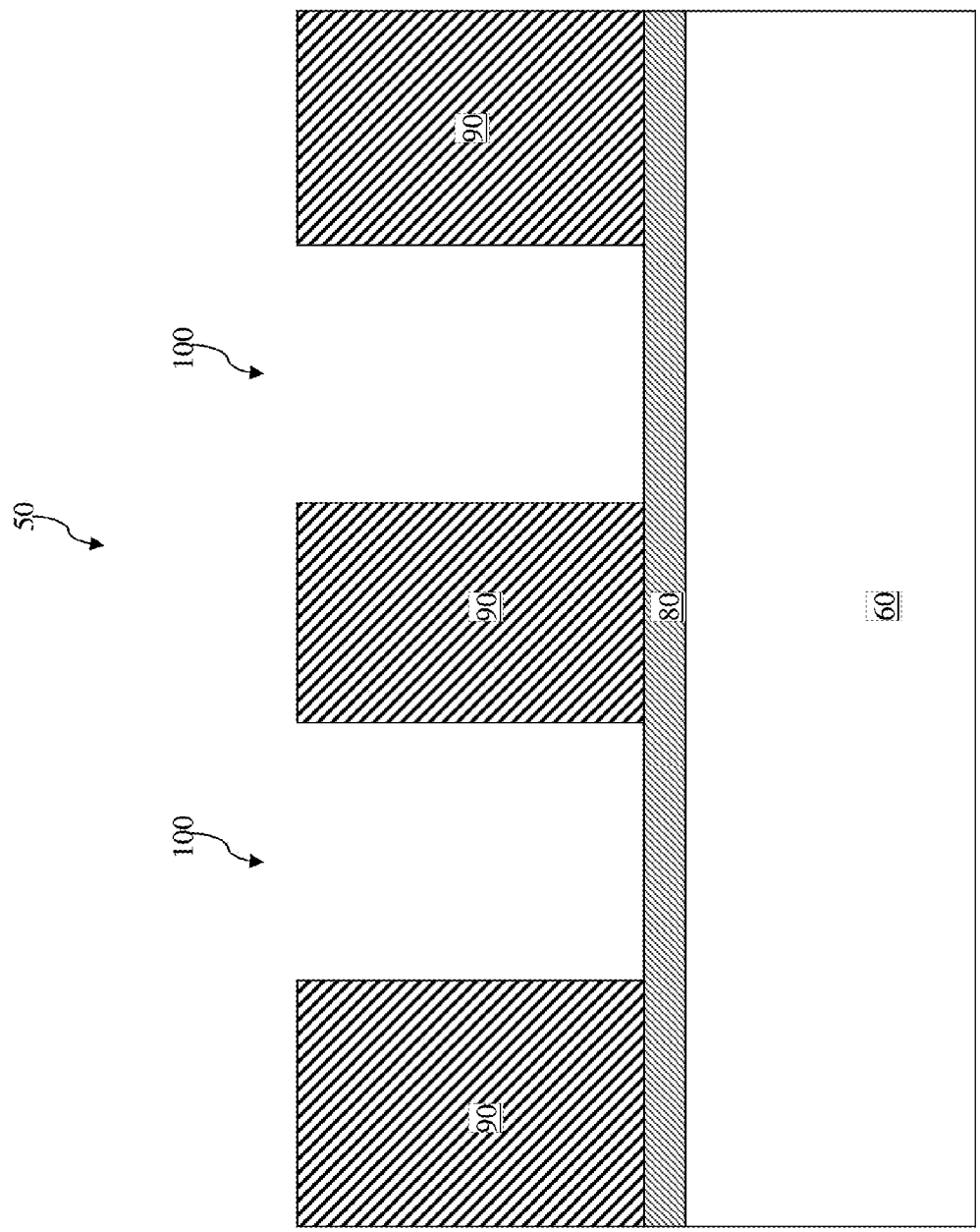

Referring to FIG. 2, a semiconductor device 50 includes a substrate 60. In some embodiments, the substrate 60 is a silicon substrate doped with a p-type dopant such as boron (for example a p-type substrate). Alternatively, the substrate 60 could be another suitable semiconductor material. For example, the substrate 60 may be a silicon substrate that is doped with an n-type dopant such as phosphorous or arsenic (an n-type substrate). The substrate 60 could include other elementary semiconductors such as germanium and diamond. The substrate 60 could optionally include a compound semiconductor and/or an alloy semiconductor. Further, the substrate 60 could include an epitaxial layer (epi layer), may be strained for performance enhancement, and may include a silicon-on-insulator (SOI) structure.

In some embodiments, the substrate 60 is substantially conductive or semi-conductive. The electrical resistance may be less than about $10^3$ ohm-meter. In some embodiments, the substrate 60 contains metal, metal alloy, or metal nitride/sulfide/selenide/oxide/silicide with the formula MXa, where M is a metal, and X is N, S, Se, O, Si, and where "a" is in a range from about 0.4 to 2.5. For example, the substrate 60 may contain Ti, Al, Co, Ru, TiN, WN2, or TaN.

In some other embodiments, the substrate 60 contains a dielectric material with a dielectric constant in a range from about 1 to about 40. In some other embodiments, the substrate 60 contains Si, metal oxide, or metal nitride, where the formula is MXb, wherein M is a metal or Si, and X is N or O, and wherein "b" is in a range from about 0.4 to 2.5. For example, the substrate 60 may contain $SiO_2$, silicon nitride, aluminum oxide, hafnium oxide, or lanthanum oxide.

It is understood that a plurality of drains/sources may be formed in the substrate 60, and a plurality of gates may be formed over the substrate 60. For reasons of simplicity, however, these drains/sources or gates are not specifically illustrated herein.

An etching-stop layer 80 is then formed over the substrate 60. The etching-stop 80 may be formed using a deposition process. In various embodiments, the etching-stop layer 80 may contain a suitable conductive material, such as a metal material.

A conductive layer 90 is then formed over the etching-stop layer 80. The conductive layer 90 may be formed by a deposition process. In various embodiments, the conductive layer 90 may contain copper, aluminum, tungsten, or combinations thereof. The material compositions for the conductive layer 90 and the etching-stop layer 80 are configured such that there is sufficient etching selectivity between the conductive layer 90 and the etching-stop layer 80. In other words, the conductive layer 90 and the etching-stop layer 80 have substantially different etching rates such that the conductive layer 90 may be etched without etching the etching-stop layer 80, or vice versa.

Referring now to FIG. 2, a plurality of openings or recesses 100 are formed in the conductive layer 90. The openings 100 are formed by an etching process, for example a dry etching process or a wet etching process. The etchant is configured such that it will etch away the conductive layer 90 while leaving the etching-stop layer 80 mostly intact, due to the high etching selectivity between the conductive layer 90 and the etching-stop layer 80. The remaining portions of the conductive layer 90 may be referred to as conductive elements 90.

Figure 3:
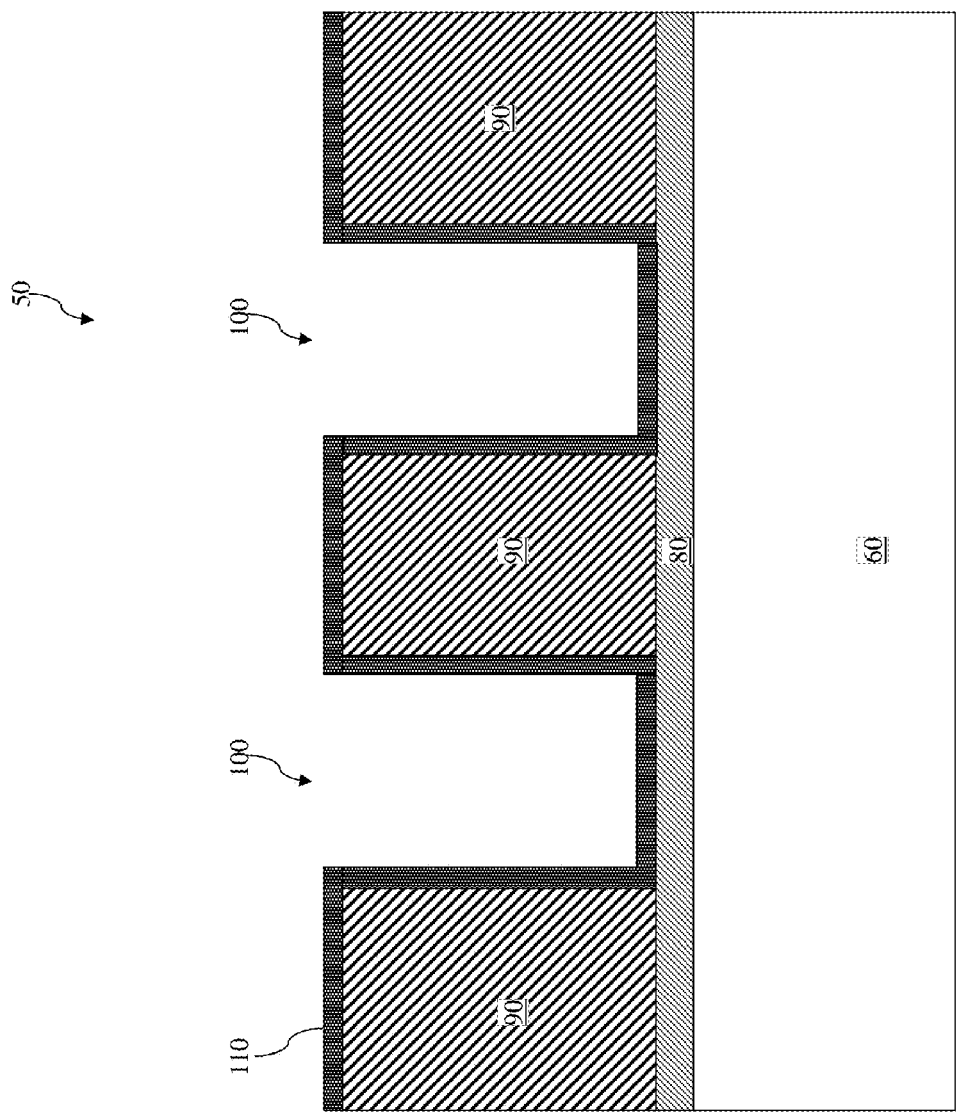

Referring now to FIG. 3, a barrier layer 110 is formed over the top surfaces and side surfaces of the conductive elements 90 (and over portions of the etching-stop layer 80 exposed by the openings 100). The barrier layer 110 is formed by a suitable deposition process and may contain a dielectric material such as silicon nitride or silicon carbide, etc.

Figure 4:
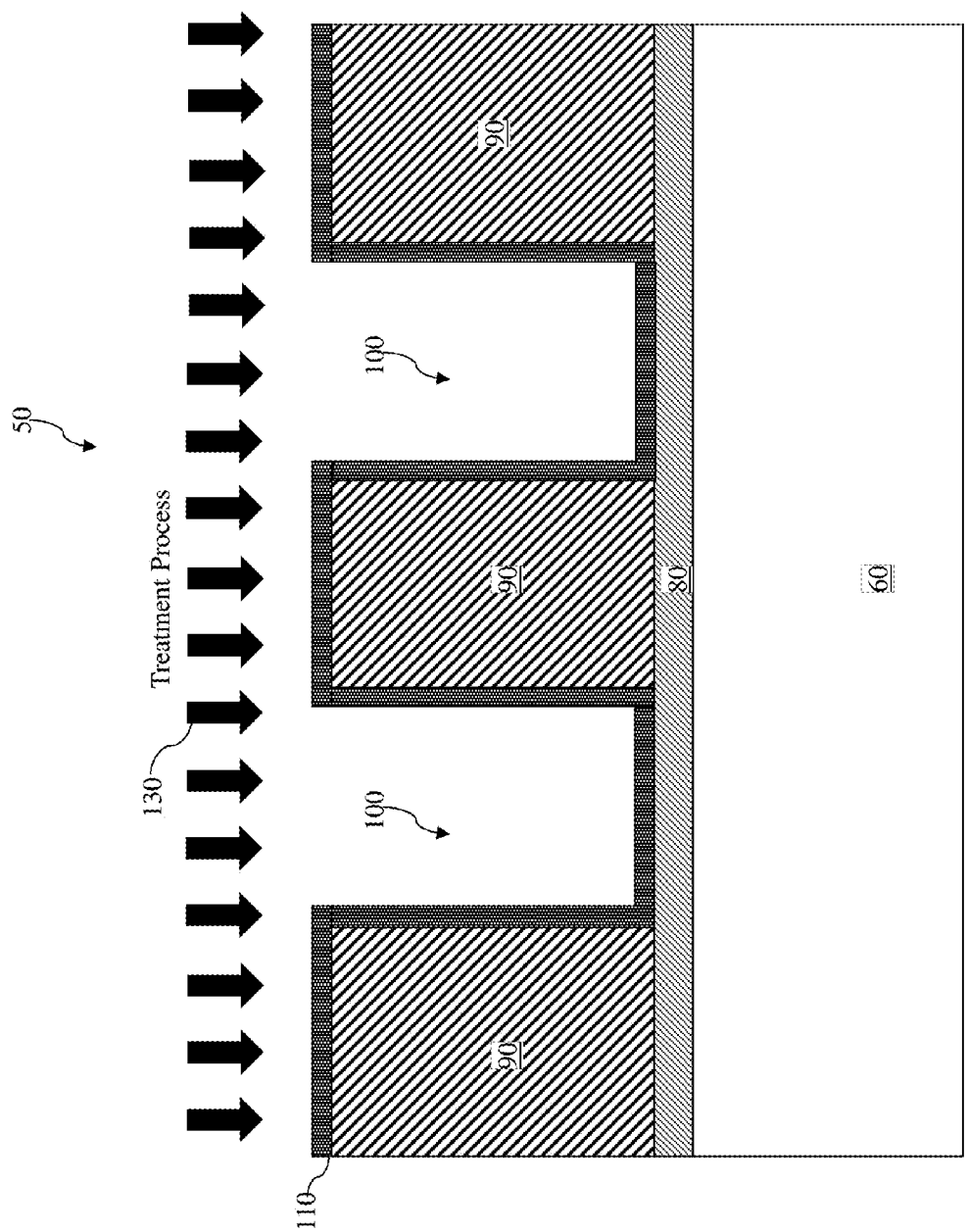

Referring now to FIG. 4, after the barrier layer 110 has been formed, a treatment process 130 is performed to treat the barrier layer 110. In some embodiments, the treatment process 130 includes a plasma treatment process using $NH_3$, $O_2$, He, Ar, $N_2O$, or $CO_2$. In some embodiments, the treatment process 130 has a flow rate in a range from about 500 standard cubic centimeters per minute (sccm) to about 2000 sccm. In some embodiments, the treatment process 130 has a process temperature in a range from about 100 degrees Celsius to about 400 degrees Celsius. In some embodiments, the treatment process 130 has a process pressure in a range from about 0.1 Torr to about 10 Torrs. In some embodiments, the treatment process 130 has a process power in a range from about 50 Watts to about 1500 Watts. In some embodiments, the treatment process 130 has a process duration in a range from about 2 seconds to about 120 seconds.

The treatment process 130 changes the hydrophobicity of the surfaces of the barrier layer 110. In more detail, without being treated by the treatment process 130, the surfaces of the barrier layer 110 are somewhat hydrophobic. After being treated by the treatment process 130, the surfaces of the barrier layer 110 become hydrophilic. Experimental data has confirmed that the process conditions of the treatment process 130 described above are configured to optimize the hydrophilic characteristics of the surfaces of the barrier layer 110. For example, in some embodiments, the hydrophilic surfaces of the barrier layer 110 have a surface contact angle less than about 93 degrees, for example in a range from about 10 degrees to about 90 degrees. The hydrophilic property of the surfaces of the barrier layer 110 will help increase the porosity of a low-k dielectric material that will be formed in the openings 100 in a later process, which will be discussed in more detail below.

Figure 5:
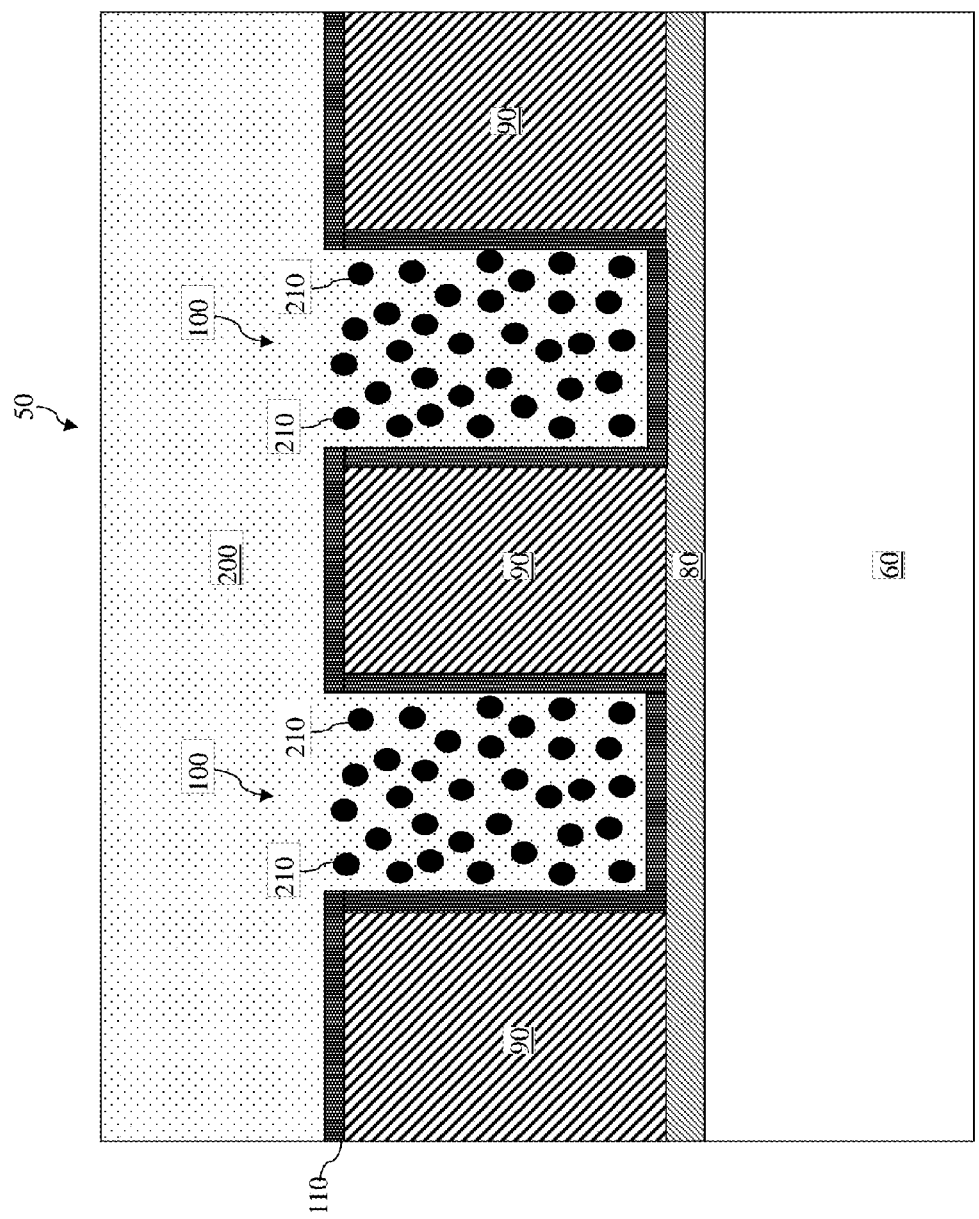

Referring now to FIG. 5, a low-k dielectric material 200 is formed over the barrier layer 110. A low-k material refers to a dielectric material whose dielectric constant is less than the dielectric constant of silicon dioxide. As is shown in FIG. 5, the low-k dielectric material 200 fills the openings 100. In some embodiments, the low-k dielectric material 200 is formed by a spin-on dielectric (SOD) coating process. The precursors for a polymer matrix of the low-k dielectric material 200 include two components: a first component that does not contains silicon-methyl (Si-Me) and a second component that does contain the Si-Me. In some embodiments, the first component (that does not contain Si-Me) contains Tetraethyl orthosilicate (TEOS) and Tetramethyl orthosilicate (TMOS). TEOS has the following chemical formula:

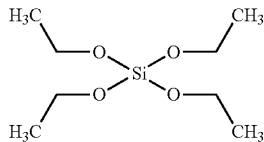

TMOS has the following chemical formula:

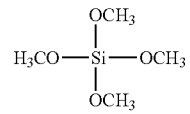

In some embodiments, the second component (that does contain Si-Me) contains Triethoxymethylsilane (MTES) and Trimethoxymethylsilane (MTMS). MTES has the following chemical formula:

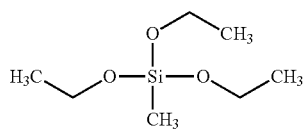

MTMS has the following chemical formula:

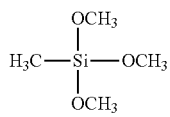

Figure 6A:
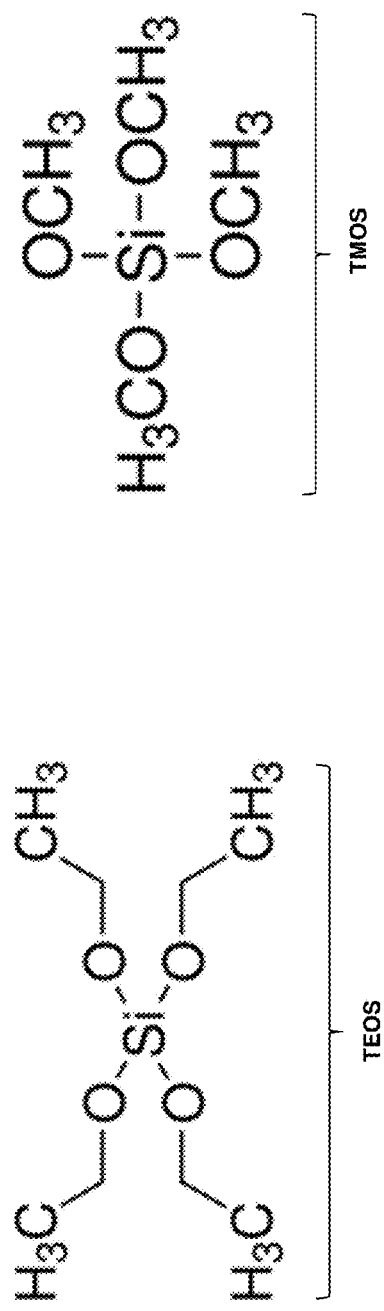
FIGS. 6A-6B illustrate chemical formulas of a first component and a second component of a precursor used in forming a low-k dielectric material in accordance with some embodiments of the present disclosure.
Figure 6B:
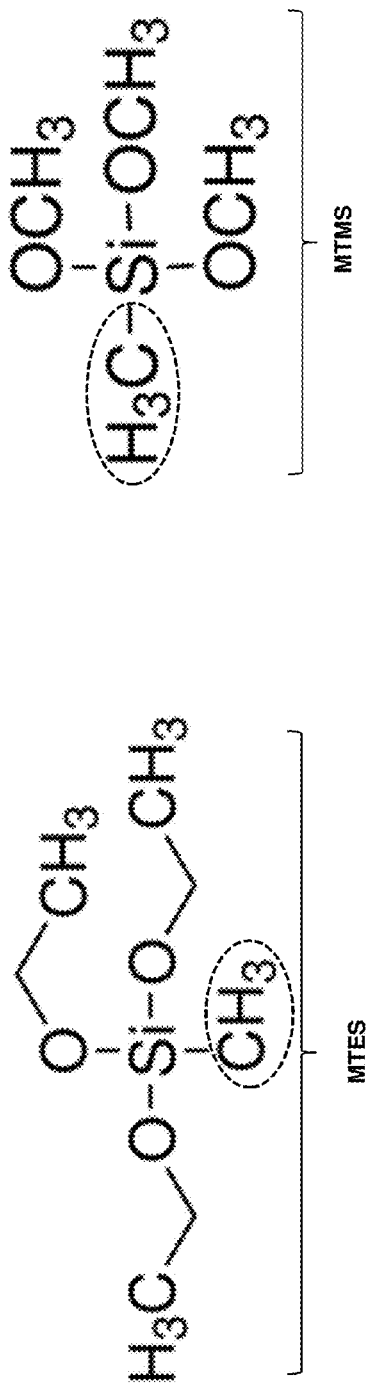

The chemical formulas for TEOS, TMOS, MTES, and MTMS are also shown in FIGS. 6A and 6B.

According to the various aspects of the present disclosure, the methyl content ($CH_3$, or Me) can affect the properties of the resulting low-k dielectric material 200. As an example, the Si-Me content of the precursor is correlated with (or affects) the resulting silicon-carbon (Si—C) area in the low-k dielectric material 200. The Si-Me content may also affect the hydrophobicity of the low-k dielectric material 200. Whereas conventional methods for forming a low-k dielectric material pay little attention to the Si-Me content of the precursors, the present disclosure recognizes that it is beneficial to configure the Si-Me content to affect the properties of the low-k dielectric material 200, which will affect the formation of the porous structures as discussed later.

In some embodiments, the Si-Me content is controlled by configuring the mixing ratio (in terms of moles) of the second component (contains Si-Me) and the first component (no Si-Me) of the precursor. For example, the mixing ratio of the second component to the first component of the precursor is configured to be in a range from about 0.1 to about 10 according to various aspects of the present disclosure. In some embodiments, the mixing ratio of the second component to the first component of the precursor is configured to be in a range from about 0.3 to about 3. These ranges are configured to optimize the material properties of the low-k dielectric material 200 to facilitate the formation of the porous structures in portions of the low-k dielectric material within the openings 100. In some embodiments, the ranges discussed above for the mixing ratio may result in a Si—C area that is larger than about 8.3.

Figure 7:
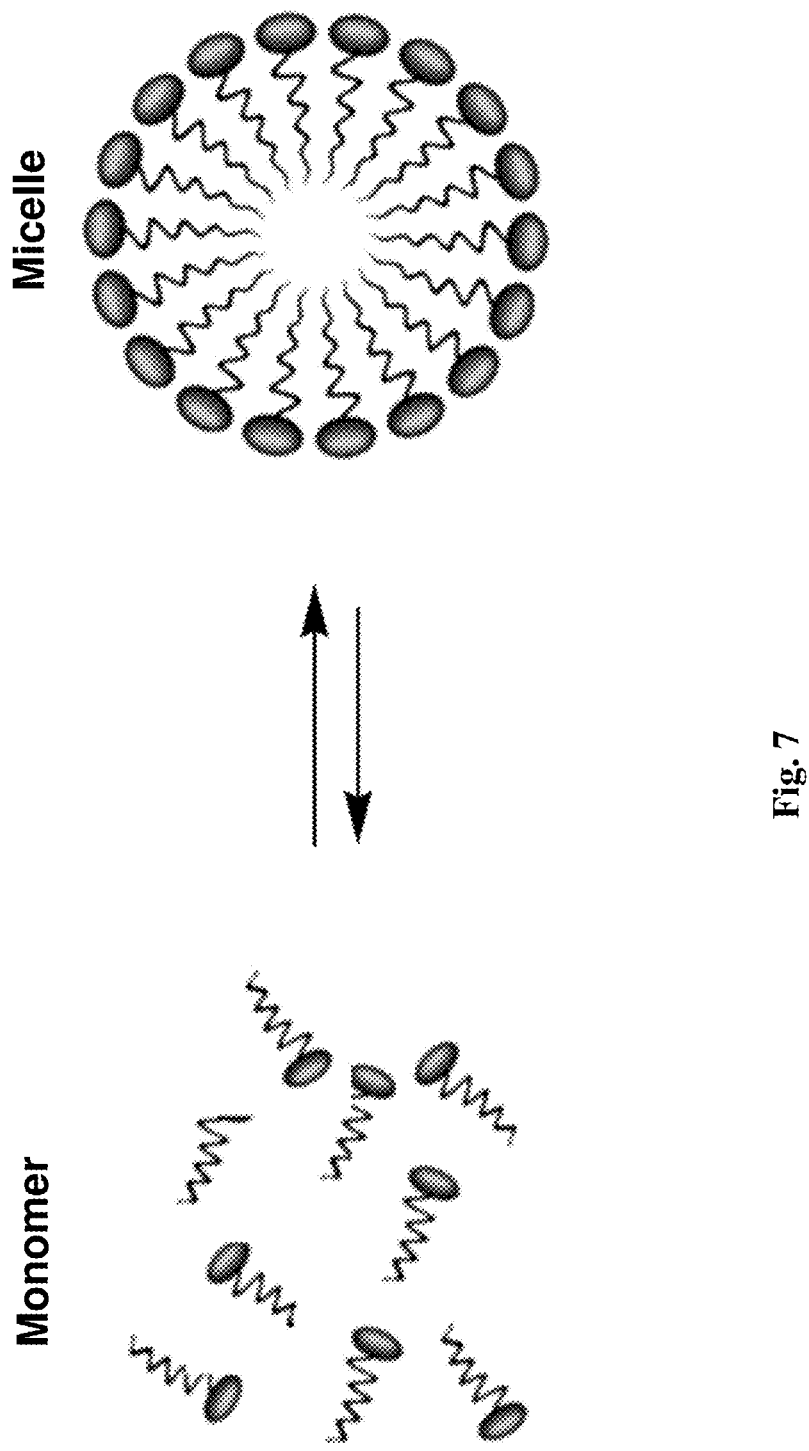
FIG. 7 illustrates diagrams of monomers and a micelle that is made up of the monomers in accordance with some embodiments of the present disclosure.

Referring back to FIG. 5, the low-k dielectric material 200 contains a plurality of porogen molecules 210. According to the various aspects of the present disclosure, the porogens molecules 210 include surfactants that can form micelles (also referred to as micelle templates), which are lipid molecules that arrange themselves in an approximately spherical form in aqueous solutions. To provide an example, FIG. 7 illustrates a diagram of a micelle and a plurality of monomers that collectively make up the micelle according to an embodiment of the present disclosure.

Figure 8A:
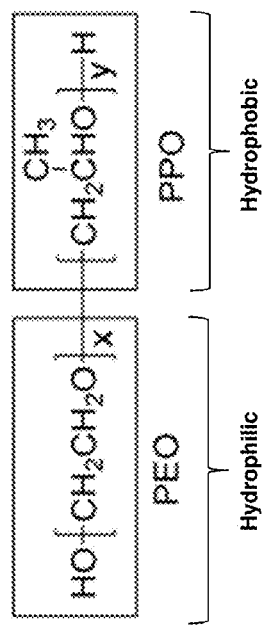
FIGS. 8A-8B illustrate chemical formulas of surfactant type porogens that can form the micelle of FIG. 7 in accordance with some embodiments of the present disclosure.
Figure 8B:
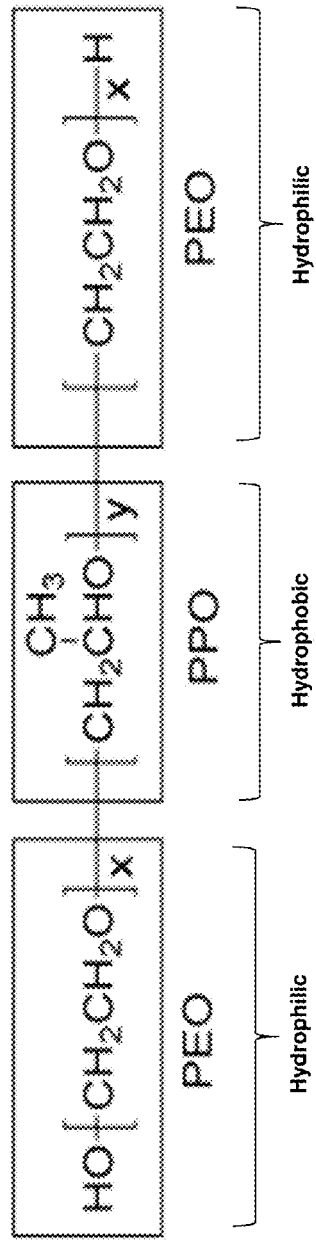

A micelle contains both a hydrophobic region and a hydrophilic region. FIGS. 8A and 8B illustrate chemical formulas of two example embodiments of a surfactant type porogen that can form the micelle template of FIG. 6. In FIG. 8A, the surfactant type porogen is a diblock co-polymer that has a hydrophilic component and a hydrophobic component. In some embodiments, the hydrophilic component is polyethylene oxide (referred to as PEO), and the hydrophobic component is polypropylene oxide (referred to as PPO). In these embodiments, the diblock co-polymer has the following chemical formula (also shown in FIG. 8A):

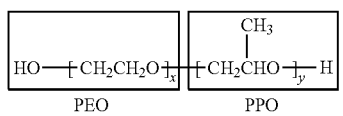

In FIG. 8B, the surfactant type porogen is a triblock co-polymer that has a first hydrophilic component, a hydrophobic component, and a second hydrophilic component. In some embodiments, the first hydrophilic component is PEO, the hydrophobic component is PPO, and the second hydrophilic component is also PEO. In these embodiments, the triblock co-polymer has the following chemical formula (also shown in FIG. 8B):

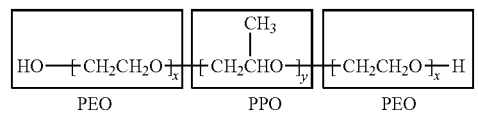

Regardless of the embodiment, it is understood that the regions of the micelle (shown in FIG. 7) at or near the outside surface (i.e., the spherical surface) are hydrophilic according to the embodiments of the present disclosure.

Referring back to FIG. 5 again, the fact that the outer surfaces of the micelles are hydrophilic helps facilitate the movement of the porogens 210 toward the openings 100, especially since the treated surface of the barrier layer 110 are also hydrophilic. In other words, because the micelles in the porogens 210 have hydrophilic outer surfaces, they are attracted to the hydrophilic surfaces of the treated barrier layer 110. Thus, the porogens 210 inside the low-k dielectric material 200 get "sucked" into the openings 100 and will get "trapped" inside the openings 100 due to the forces of surface attraction. As discussed above, the carefully configured Si-Me content for the precursor components also facilitates the movement of the porogens into the openings 100. The low-k material 200 may have a hydrophobicity that effectively "pushes" the porogens 210 downward into the openings 100.

It has been observed through experimental data that if the process conditions (e.g, 1. the treatment process 130 for making the barrier layer 110 more hydrophilic, and 2. the mixing ratio for the matrix precursor components to achieve a desired Si-Me content) are configured correctly, a substantial majority of the porogens 210 will be "trapped" inside the openings 100. In some embodiments, almost all (e.g., greater than 99%) of the porogens 210 that are greater than a certain size will be "trapped" inside the openings 100. The porogens that are not inside the openings 100 may be significantly smaller, to the extent that they may even appear invisible to an electronic inspection machine (e.g., a Fourier Transform Infrared Spectroscopy (FTIR) machine). For example, the porogens 210 inside the openings 100 may have diameters that are in the range of several nanometers, while the porogens outside the openings 100 may have diameters that are in the range of several angstroms, which may lead to an overall size discrepancy of hundreds of times or even thousands of times. For this reason and also for reasons of simplicity, any porogens disposed outside the openings 100 are not specifically illustrated herein.

Figure 9:
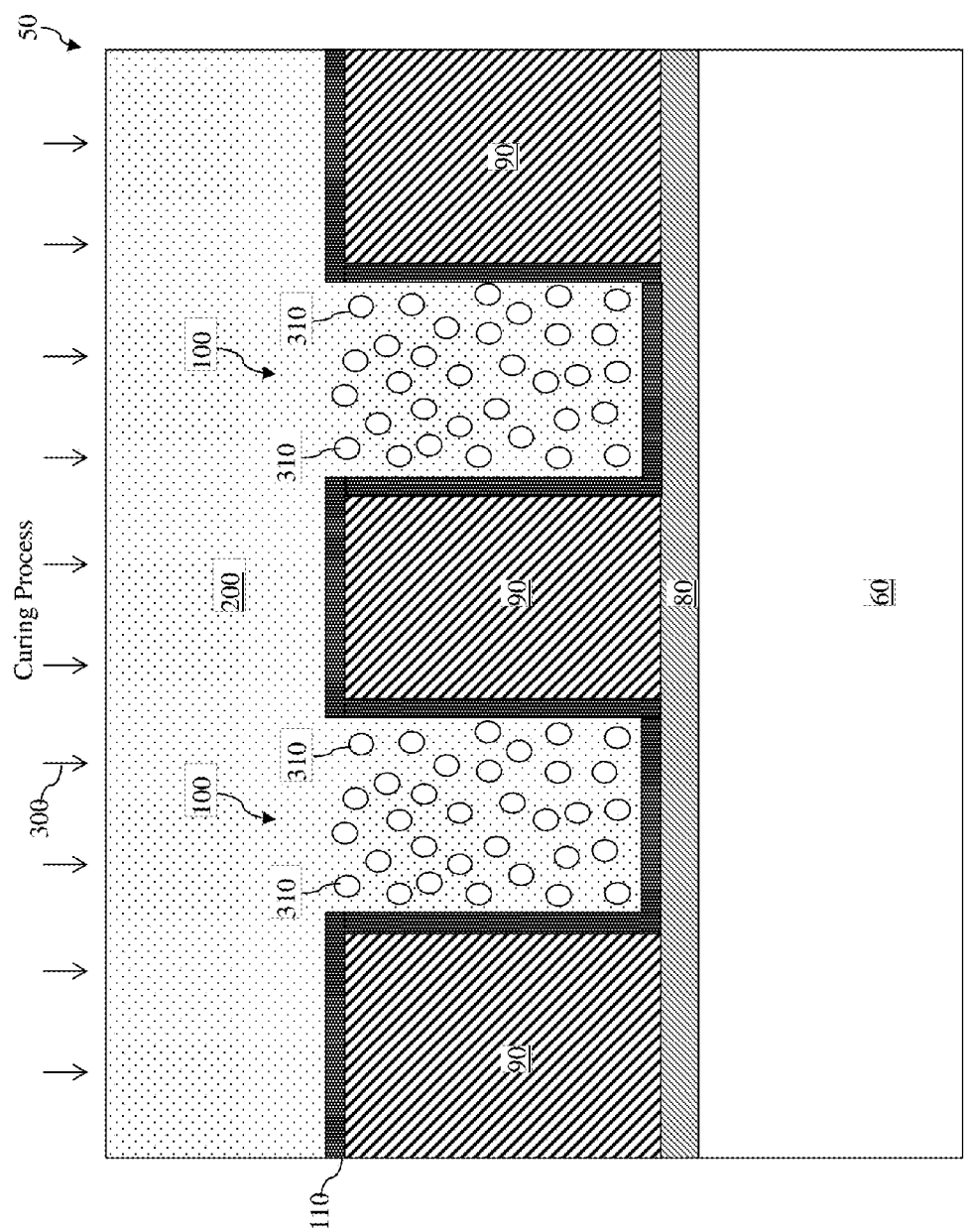

Referring now to FIG. 9, a curing process 300 is performed to the semiconductor device 50. The curing process 300 may be performed at a high temperature and may include an ultraviolet (UV) process or a thermal process. In the UV curing process, the process temperature may be in a range from about 350 degrees Celsius to about 450 degrees Celsius, and the process duration may last for about 3 minutes to about 10 minutes. In the thermal curing process, the process temperature may be in a range from about 350 degrees Celsius to about 450 degrees Celsius, and the process duration may last for about 30 minutes to about 120 minutes.

The curing process 300 transforms the porogens 210 into porous elements 310. For example, the micelles inside the porogens 210 are evaporated or otherwise removed by the curing process 300. As a result, a porous structure (i.e., an empty or hollow space) is formed in place of each of the porogens 210. The porous elements 310 make the portions of the low-k dielectric filling the openings 100 even more low-k. This is because the air inside the porous elements has a dielectric constant is that is about 1, which is lower than the dielectric constant of the low-k material itself. In this manner, the overall dielectric constant of the portions of the low-k dielectric material 200 filling the openings 100 is brought down by the presence of the porous elements 310.

Figure 10:
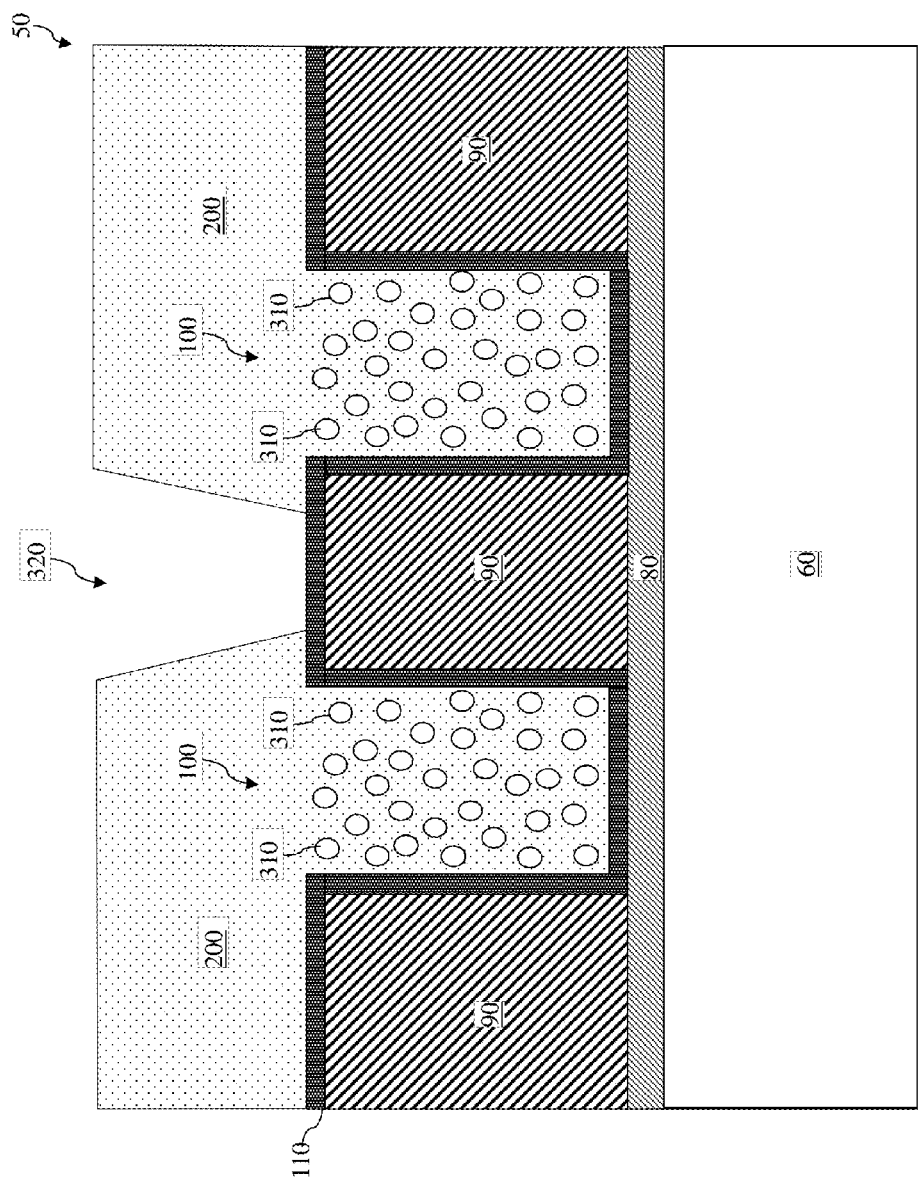

Referring now to FIG. 10, one or more via openings are formed over at least some of the conductive elements 90. For example, a via opening 320 is formed over one of the conductive elements 90. The via opening 320 may be formed by an etching process, for example a wet etching process or a dry etching process. The via opening 320 may have an inverse trapezoidal shape in some embodiments, such that it is wider at the top and narrower at the bottom. This helps a conductive material to fill in the opening 320 more easily in a subsequent process.

Figure 11:
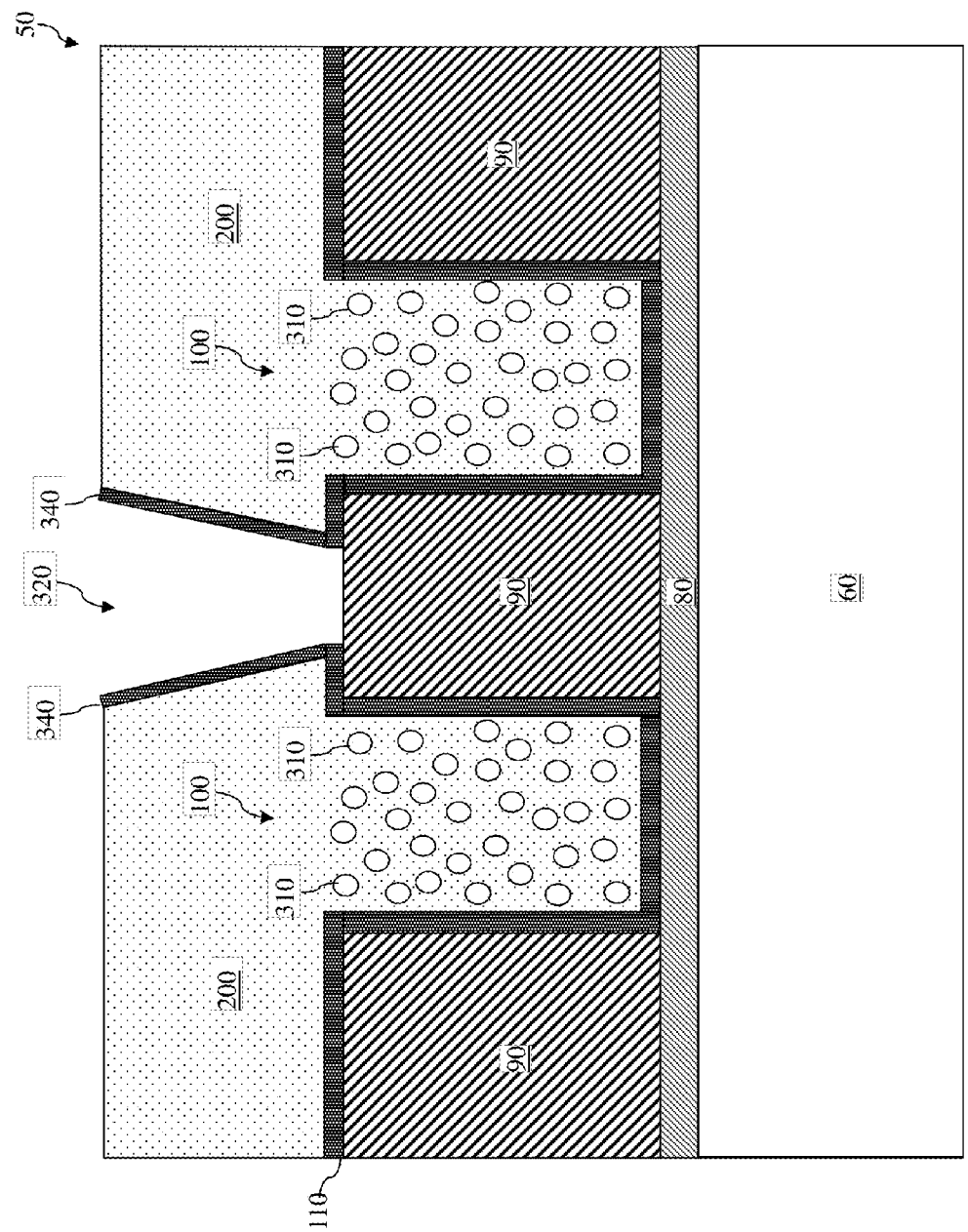

Referring now to FIG. 11, a barrier layer 340 is formed inside the via opening 320. In other words, the barrier layer 340 is formed on the sidewall surfaces of the opening 320 (sidewalls of the low-k dielectric material 200) and over the portion of the barrier layer 110 above the conductive element 90. In some embodiments, the barrier layer 340 is formed by a suitable deposition process. In some embodiments, the barrier layer 340 and the barrier layer 110 have the same material compositions and are formed by similar deposition processes. Thereafter, the portions of the barrier layers 340 and 110 disposed below the via opening 320 are etched away, so that a portion of the conductive element 90 is exposed by the via opening 320.

Figure 12:
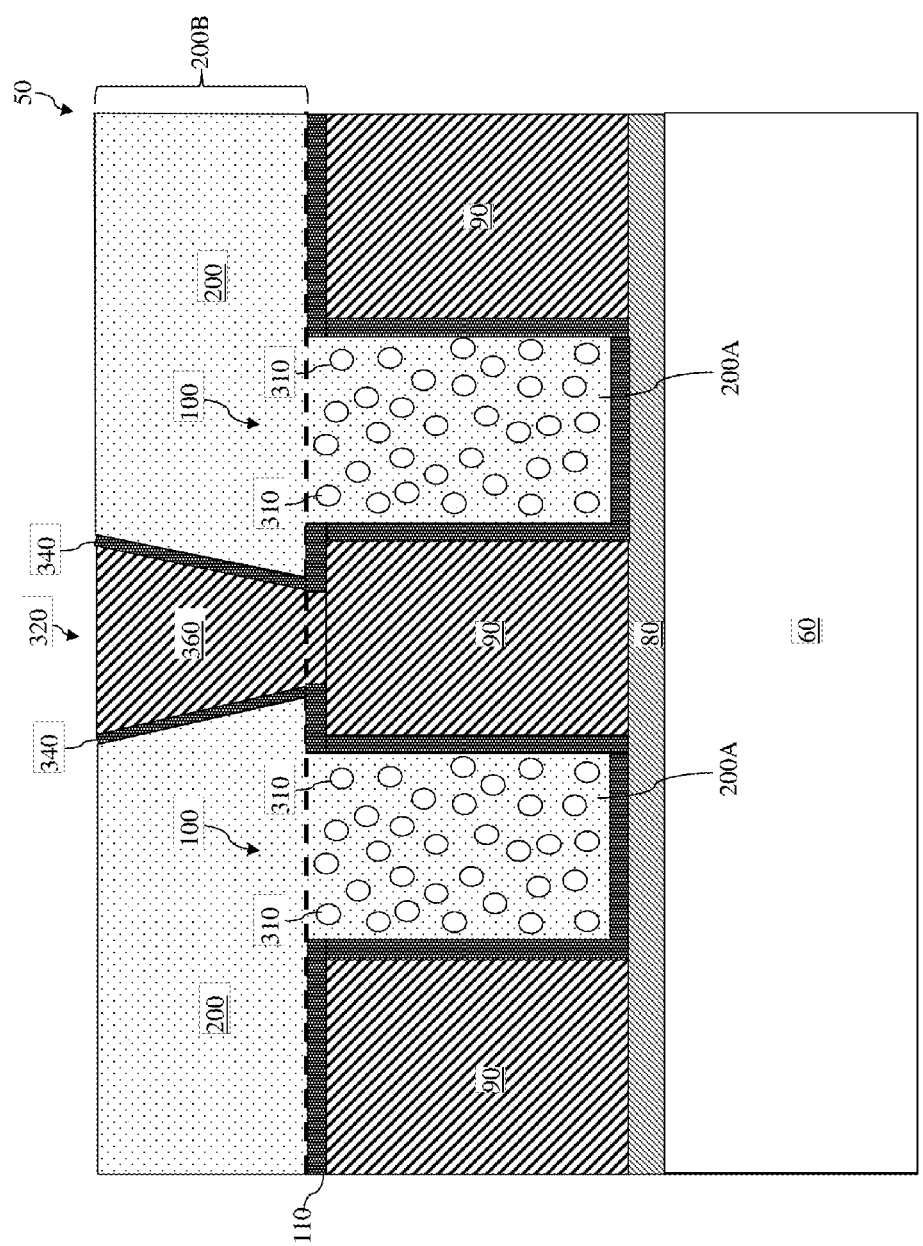

Referring now to FIG. 12, a conductive via 360 is formed inside the via opening 320. The conductive via 360 may be formed by a suitable deposition process. The conductive via 360 may contain a metal material, for example copper, aluminum, tungsten, or combinations thereof. It is understood that the conductive via 360 and the conductive element 90 may be formed as a part of a multi-layered interconnect structure. For example, the conductive elements 90 may be formed as the metal lines in a particular interconnect layer (e.g., Metal-0 or Metal-1) of the interconnect structure, and the conductive via 360 provides electrical connections between the conductive element 90 therebelow with other elements (e.g., another metal line) in a different interconnect layer of the interconnect structure.

The low-k dielectric material 200 provides electrical insulation for the various conductive elements 90. The low-k dielectric material 200 may be conceptually divided into portions 200A and 200B, which are conceptually separated by the broken lines illustrated in FIG. 12. It is understood that there is no actual physical separation between the portions 200A and 200B, and that the conceptual division herein is merely to facilitate the ensuing discussions. The portions 200A are the segments of the low-k dielectric material 200 that fill the openings 100, whereas the portion 200B are the segments of the low-k dielectric material 200 that are disposed outside the openings 100 (and above the portion 200A).

As discussed above, due to the hydrophilic properties of the treated surfaces of the barrier layer 110 inside the openings 100 as well as the hydrophilic properties of the outer surfaces of the porogens 210 (shown in FIG. 5), the porogens 210 inside the low-k dielectric material 200 are congregated inside the portion 200A of the low-k dielectric material 200. The carefully configured mixing ratio of the Si-Me-containing and non-Si-Me-containing precursors also result in properties of the low-k dielectric material that help push the porogens 210 downward into the portion 200A. As a result, following the curing process 300 that transforms these porogens 210 into the porous elements 310, the porosity of the portion 200A of the low-k dielectric material 200 is substantially greater than the porosity of the portion 200B of the low-k dielectric material 200. This is because of the high concentration of the porous elements 310 inside the portion 200A, while the porous elements disposed inside the portion 200B are significantly smaller in size (e.g., diameter differences of 5-10 times) and number. For this reason and also for reasons of simplicity, the porous elements in the portion 200B are not specifically illustrated herein. In some embodiments, the portion 200A is at least 1.3 times to 3 times more porous than the portion 200B. For example, the porosity of the portion 200A is in a range from about 20% to about 30%, while the porosity of the portion 200B is in a range from about 10% to about 15%.

Also, since the porous elements 310 comprise mostly of air—which has a low dielectric constant of about 1—consequently the dielectric constant of the portion 200A of the low-k dielectric material 200 is substantially lower than the dielectric constant of the portion 200B of the low-k dielectric material 200. In some embodiments, the dielectric constant of the portion 200A is in a range from about 1.3 to about 2.3, while the dielectric constant of the portion 200B is in a range from about 2.3 to about 3.5. The lower value of the dielectric constant of the portion 200A is beneficial, since the portion 200A is the portion that provides electrical isolation between the conductive elements 90. In this regard, the low-k material 200 is made to be even more "low-k." Among other things, the lower value of the dielectric constant improves an RxC performance.

Figure 13:
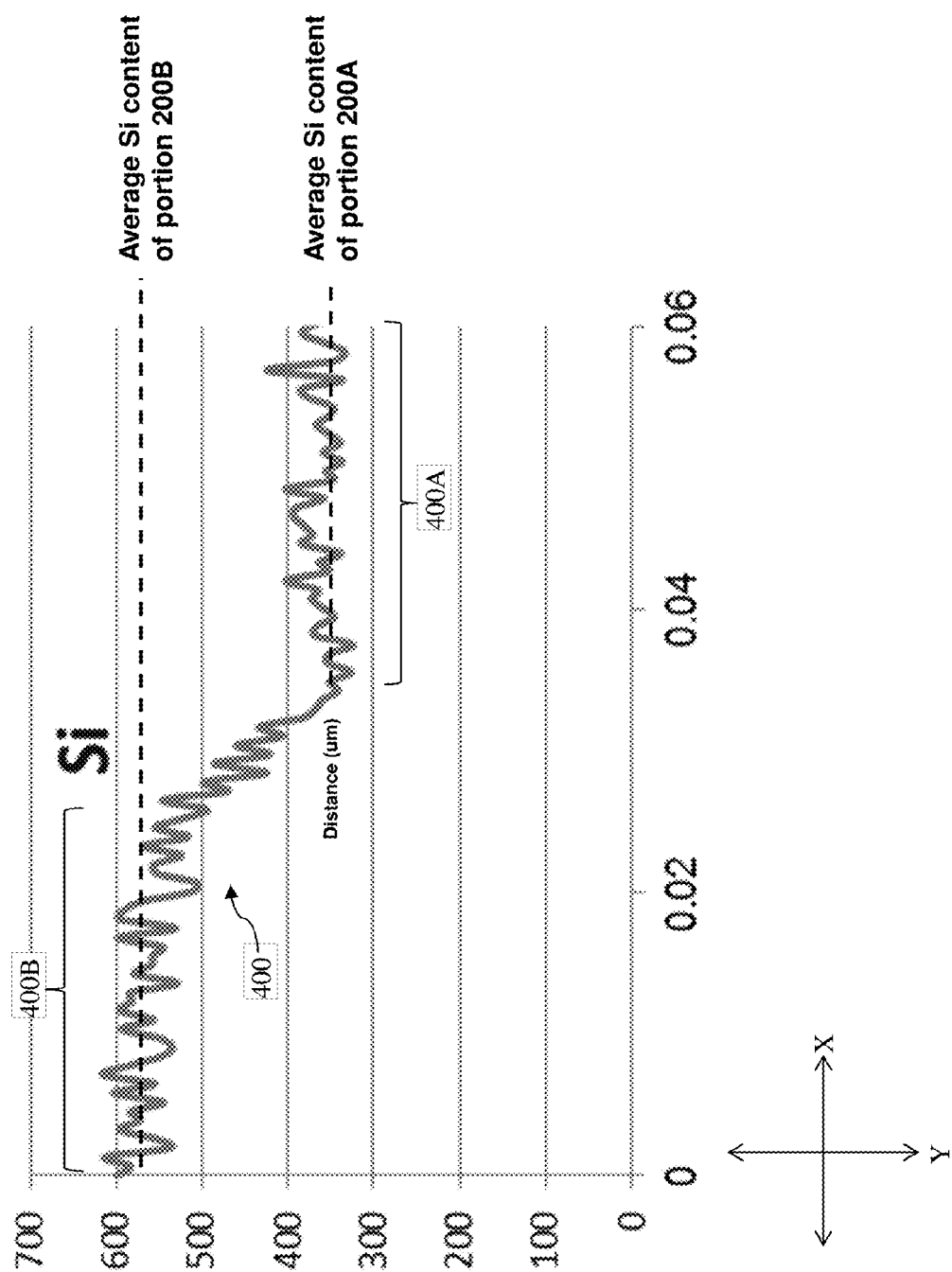
FIG. 13 is a graph illustrating the variation of silicon content inside a low-k dielectric material in accordance with some embodiments of the present disclosure.

As a corollary to the differences in porosity and dielectric constant between the portions 200A and 200B of the low-k dielectric material 200, the silicon content for these two portions 200A and 200B are also different. This is shown in FIG. 13, which is a graph illustrating the silicon content of an experimental sample. The graph has an X-axis and a Y-axis. The X-axis represents depth or distance (measured from top to bottom), and the Y-axis represents the silicon content. A plot 400 is shown in FIG. 13. The plot 400 represents the silicon content of the low-k dielectric material 200 as it varies from the top (e.g., near the upper surface of the via 360) to the bottom of the openings 100.

Based on the plot 400, it can be seen that the silicon content of the low-k dielectric layer is remain uniform throughout. In a segment 400A of the plot 400, which represents the silicon content of approximately the portion 200A of the low-k dielectric material filling the openings 100, the silicon content is low. This is another way of saying that the porosity of the portion 200A of the low-k dielectric material 200 filling the openings 100 is high. Conversely, in a segment 400B of the plot 400, which represents the silicon content of approximately the portion 200B of the low-k dielectric material outside the openings 100, the silicon content is high. This is another way of saying that the porosity of the portion 200B of the low-k dielectric material 200 disposed above the conductive elements 90 is low.

Figure 14:
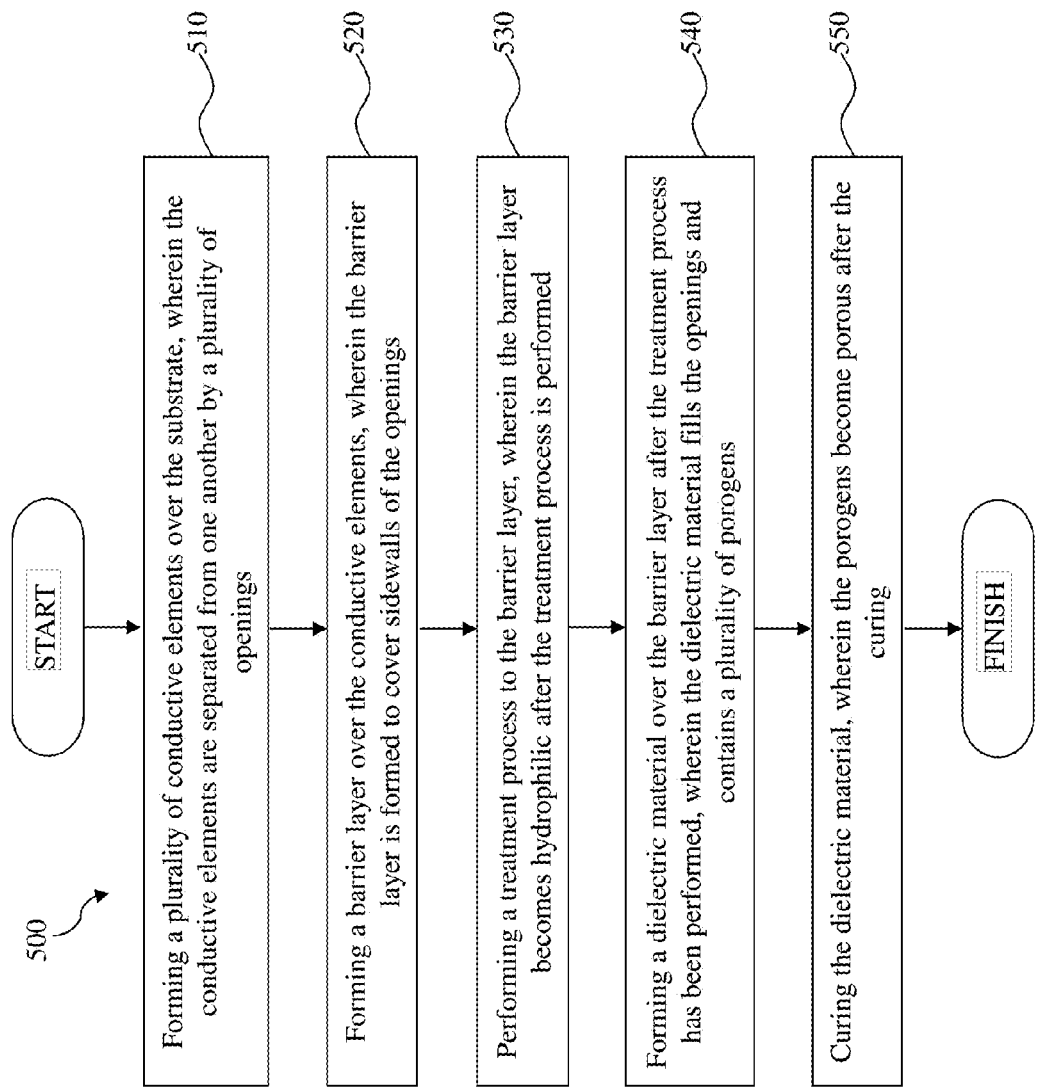
FIG. 14 is a flowchart illustrating a method of fabricating a semiconductor device in accordance with some embodiments of the present disclosure.

FIG. 14 is a flowchart of a method 500 of performing a semiconductor fabrication process according to various aspects of the present disclosure.

The method 500 includes a step 510 of forming a plurality of conductive elements over the substrate. The conductive elements are separated from one another by a plurality of openings.

The method 500 includes a step 520 of forming a barrier layer over the conductive elements. The barrier layer is formed to cover sidewalls of the openings.

The method 500 includes a step 530 of performing a treatment process to the barrier layer. The barrier layer becomes hydrophilic after the treatment process is performed. In some embodiments, the treatment process comprises a plasma process using $NH_3$, $O_2$, He, Ar, $N_2O$, or $CO_2$. In some embodiments, the treatment process is performed under the following process conditions: a flow rate in a range from about 500 standard cubic centimeters per minute (sccm) to about 2000 sccm; a process temperature in a range from about 100 degrees Celsius to about 400 degrees Celsius; a process pressure in a range from about 0.1 Torr to about 10 Torrs; a process power in a range from about 50 Watts to about 1500 Watts; and a process duration in a range from about 2 seconds to about 120 seconds.

The method 500 includes a step 540 of forming a dielectric material over the barrier layer after the treatment process has been performed. The dielectric material may be a low-k dielectric material having a dielectric constant lower than the dielectric constant of silicon dioxide. The dielectric material fills the openings and contains a plurality of porogens. In some embodiments, the step 540 of forming the dielectric material comprises configuring a mixing ratio of a methyl-containing precursor component to a methyl-free precursor component. In some embodiments, the forming of the dielectric material is performed such that the porogens congregated inside the openings.

The method 500 includes a step 550 of curing the dielectric material. The porogens become porous after the curing.

It is understood that additional processes may be performed before, during, or after the steps 510-550 of the method 500 to complete the fabrication of the semiconductor device. For example, the method 500 may include a step of forming a via opening over at least one of the conductive elements, and a step of forming a conductive via in the via opening. For reasons of simplicity, additional fabrication steps are not discussed herein in detail.

Based on the above discussions, it can be seen that the present disclosure offers advantages over conventional methods and devices of low-k dielectric material fabrication. It is understood, however, that other embodiments may offer additional advantages, and not all advantages are necessarily disclosed herein, and that no particular advantage is required for all embodiments. One advantage is that the low-k material of the present disclosure offers improved performance due to the enhanced porosity. As discussed above, the surface treatment of the barrier layer to make it more hydrophilic attracts the porogens (also having hydrophilic outer surfaces) to be moved to inside the openings 100 that separate the conductive elements. The carefully configured mixing ratio of the matrix precursor components also result in a material with properties that help push the porogens down toward the openings. Consequently, after the curing process that transforms the porogens into the porous structures inside the low-k dielectric material, the portions of the low-k dielectric material filling the openings have substantially greater porosity than the portions of the low-k dielectric material outside the openings. The greater porosity corresponds to a lower dielectric constant. Since the portions of the low-k dielectric material inside the openings provide electrical isolation between the conductive elements, the lower dielectric constant is beneficial, for example it enhances the RxC performance.

Another advantage is that the present disclosure does not require many changes to the existing method of fabrication. As such, it does not significantly increase fabrication cost, if at all.

One aspect of the present disclosure pertains to a semiconductor device. The semiconductor device includes a substrate and a plurality of conductive elements disposed over the substrate. The conductive elements are separated from one another by a plurality of openings. A dielectric material is disposed over and between the conductive elements. The dielectric material includes: a first portion that is disposed inside the openings; and a second portion that is disposed over the openings and over the conductive elements. The first portion is substantially more porous than the second portion.

Another aspect of the present disclosure pertains to a semiconductor device. The semiconductor device includes a substrate and a plurality of metal elements disposed over the substrate. A low-k dielectric material disposed in between, and over, the metal elements. The low-k dielectric material includes a first portion that is disposed between the metal elements. The first portion has a first dielectric constant. The low-k dielectric material includes a second portion that is disposed over the metal elements. The second portion has a second dielectric constant. The first dielectric constant is lower than the second dielectric constant. The first dielectric constant and the second dielectric constant are each less than a dielectric constant of silicon dioxide.

Yet another aspect of the present disclosure pertains to a method of fabricating a semiconductor device. A plurality of conductive elements is formed over the substrate. The conductive elements are separated from one another by a plurality of openings. A barrier layer is formed over the conductive elements. The barrier layer is formed to cover sidewalls of the openings. A treatment process is performed to the barrier layer. The barrier layer becomes hydrophilic after the treatment process is performed. A dielectric material is formed over the barrier layer after the treatment process has been performed. The dielectric material fills the openings and contains a plurality of porogens.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A semiconductor device, comprising:
    a substrate;
    a plurality of conductive elements disposed over the substrate, wherein the conductive elements are separated from one another by a plurality of openings; and
    a dielectric material disposed over and between the conductive elements, wherein the dielectric material includes:

a first portion that is disposed inside the openings; and
a second portion that is disposed over the openings and over the conductive elements;
wherein:
the dielectric material contains a plurality of porous elements; and
a density of the porous elements in the first portion is substantially greater than a density of the porous elements in the second portion.

2. The semiconductor device of claim 1, wherein the first portion of the dielectric material has a substantially lower dielectric constant than the second portion of the dielectric material.

3. The semiconductor device of claim 1, wherein:
the porous elements in the first portion have diameters in a range of several nanometers; and
the porous elements in the second portion have diameters in a range of several angstroms.

4. The semiconductor device of claim 1, further comprising a barrier layer disposed between the conductive elements and the dielectric material, wherein surfaces of the barrier layer have hydrophilic characteristics.

5. The semiconductor device of claim 1, wherein the conductive elements are metal lines of an interconnect structure.

6. The semiconductor device of claim 1, further comprising one or more conductive vias disposed over at least some of the conductive elements.

7. The semiconductor device of claim 1, wherein the dielectric material has a dielectric constant less than a dielectric constant of silicon dioxide.

8. The semiconductor device of claim 1, wherein:
the first portion has a first porosity in a range from about 10%-15%; and
the second portion has a second porosity in a range from about 20%-30%.

9. The semiconductor device of claim 1, wherein the porous elements disposed in the first portion of the dielectric material are substantially larger in size than the porous elements disposed in the second portion of the dielectric material.

10. A semiconductor device, comprising:
a substrate;
a plurality of metal elements disposed over the substrate;
a low-k dielectric material disposed in between, and over, the metal elements, wherein the low-k dielectric material includes:
a first portion that is disposed between the metal elements, the first portion having a first dielectric constant; and
a second portion that is disposed over the metal elements, the second portion having a second dielectric constant, wherein the first portion is more porous than the second portion; and
a barrier layer disposed between the metal elements and the low-k dielectric material, wherein surfaces of the barrier layer are hydrophilic;
wherein:
a plurality of porous structures exist between adjacent metal elements;
the first dielectric constant is lower than the second dielectric constant; and
the first dielectric constant and the second dielectric constant are each less than a dielectric constant of silicon dioxide.

11. The semiconductor device of claim 10, wherein:
the first portion has a first porosity in a range from about 10%-15%; and
the second portion has a second porosity in a range from about 20%-30%.

12. The semiconductor device of claim 10, wherein the metal elements are metal lines of an interconnect structure, and wherein the interconnect structure further comprises one or more vias disposed over at least some of the metal elements.

13. A semiconductor device, comprising:
a substrate;
a plurality of conductive elements over the substrate, wherein the conductive elements are separated from one another by a plurality of openings;
a hydrophilic barrier layer over the conductive elements, wherein the barrier layer covers sidewalls of the openings; and
a porous dielectric material over the barrier layer and inside the openings.

14. The semiconductor device of claim 13, wherein the porous dielectric material includes:
a first portion that is disposed between the conductive elements, the first portion having a first dielectric constant; and
a second portion that is disposed over the conductive elements, the second portion having a second dielectric constant.

15. The semiconductor device of claim 14, wherein:
the first dielectric constant is lower than the second dielectric constant; and
the first dielectric constant and the second dielectric constant are each less than a dielectric constant of silicon dioxide.

16. The semiconductor device of claim 13, further comprising:
a via opening over at least one of the conductive elements; and
a conductive material in the via opening.

17. The semiconductor device of claim 13, wherein the porous dielectric material comprises configuring a mixing ratio of a methyl-containing precursor component to a methyl-free precursor component.

18. The semiconductor device of claim 13, wherein the porous dielectric material includes porogens congregated inside the openings.

19. The semiconductor device of claim 13, wherein the porous dielectric material has a dielectric constant lower than a dielectric constant of silicon dioxide.

20. The semiconductor device of claim 13, wherein the hydrophilic barrier layer completely covers sidewalls of the openings.

* * * * *